(12) United States Patent
Moriyama et al.

(10) Patent No.: US 7,365,264 B2
(45) Date of Patent: Apr. 29, 2008

(54) THERMOELECTRIC CONVERTER AND MANUFACTURING METHOD THEREOF

(75) Inventors: Jyouji Moriyama, Kariya (JP); Tsutomu Sakakibara, Susono (JP); Mitsuhiro Ando, Toyohashi (JP)

(73) Assignee: Aisin Seiki Kabushiki Kaisha, Kariya-shi (JP)

( * ) Notice: Subject to any disclaimer, the term of this patent is extended or adjusted under 35 U.S.C. 154(b) by 874 days.

(21) Appl. No.: 10/758,224

(22) Filed: Jan. 16, 2004

(65) Prior Publication Data
US 2005/0000558 A1 Jan. 6, 2005

(30) Foreign Application Priority Data
Jan. 17, 2003 (JP) ............................. 2003-010310

(51) Int. Cl.
*H01L 35/34* (2006.01)
(52) U.S. Cl. ...................................... 136/200; 136/205
(58) Field of Classification Search ................ 136/200, 136/203
See application file for complete search history.

(56) References Cited

U.S. PATENT DOCUMENTS
6,492,585 B1 * 12/2002 Zamboni et al. ............ 136/201

FOREIGN PATENT DOCUMENTS
| JP | 62-178554 | 11/1987 |
| JP | 08-018109 | 1/1996 |
| JP | 3225049 | 8/2001 |
| JP | 2001-332773 | 11/2001 |

* cited by examiner

Primary Examiner—Nam Nguyen
Assistant Examiner—Luan V. Van
(74) Attorney, Agent, or Firm—Oblon, Spivak, McClelland, Maier & Neustadt, P.C.

(57) ABSTRACT

A thermoelectric converting device includes a P type thermoelectric element, an N type thermoelectric element, the N type thermoelectric element connected with the P type thermoelectric element alternately to be electrically in series, an electrode circuit contacting the P type thermoelectric element and the N type thermoelectric element, an insulation substrate, at least one electric circuit forming a layer with the electrode circuit via the insulation substrate, and a conduction member for electrically conducting the electrode circuit and the electric circuit.

7 Claims, 16 Drawing Sheets

FIG.13

| Power Consumption | Thermoelectric Converter 1 (first embodiment) | Thermoelectric Converter 11 (second embodiment) | Thermoelectric Converter 21 (known) |
|---|---|---|---|
| | 0.31W | 0.31W | 0.40W |

THERMOELECTRIC CONVERTER AND MANUFACTURING METHOD THEREOF

This application is based on and claims priority under 35 U.S.C. § 119 with respect to Japanese Patent Application No. 2003-010310 filed on Jan. 17, 2003, the entire contents of which are incorporated herein by reference.

FIELD OF THE INVENTION

The present invention relates to a thermoelectric converter and a manufacturing method thereof. More particularly, the present invention pertains to a thermoelectric converter including a P type thermoelectric element and an N type thermoelectric element electrically arranged in series alternately and a manufacturing method thereof.

BACKGROUND OF THE INVENTION

A known thermoelectric converter described in Japanese Utility Model Laid-Open Publication No. S62-178554 has a thermoelectric conversion portion including plural pairs of thermoelectric elements (i.e., P type thermoelectric elements and N type thermoelectric elements) between two alumina ceramics substrate arranged opposing each other via electrodes. The electrode includes a copper thick film pattern formed at an alumina ceramic substrate surface.

A known thermoelectric converter described in Japanese Patent No. 3225049 includes a P type semiconductor block (i.e., thermoelectric element) formed with grooves and an N type semiconductor block (i.e., thermoelectric element) formed with grooves. With the thermoelectric converter described in Japanese Patent No. 3225049, the grooves of the P type semiconductor block and the grooves of the N type semiconductor block are fitted one another to form a unified block.

Notwithstanding, with the construction of the known thermoelectric converter described in Japanese Utility Patent Laid-Open Publication No. S62-178554, because the P type thermoelectric elements and the N type thermoelectric elements are arranged in alternately arrangement, the assembling process of the P type thermoelectric elements and the N type thermoelectric elements is complicated, which is a drawback for the productivity.

With the thermoelectric converter described in Japanese Patent No. 3225049, the P type semiconductor and the N type semiconductor are linearly arranged. However, with the construction of the thermoelectric converter described in Japanese Patent No. 3225049, L shaped top surface electrodes and L shaped bottom surface electrodes are required at a peripheral portion of the thermoelectric element. With the L shaped electrode, because the N type thermoelectric element and the P type thermoelectric element are connected in parallel, the Peltier effect and the Seebeck effect, or the like, is declined to decline the cooling or heating performance and the power generation effect.

A need thus exists for a thermoelectric converter including a P type thermoelectric element and an N type thermoelectric element linearly arranged each other with high productivity, high cooling and heating performance, and high power generation effect and a manufacturing method thereof.

SUMMARY OF THE INVENTION

In light of the foregoing, the present invention provides a thermoelectric converting device which includes a P type thermoelectric element, an N type thermoelectric element, the N type thermoelectric element connected with the P type thermoelectric element alternately to be electrically in series, an electrode circuit contacting the P type thermoelectric element and the N type thermoelectric element, an insulation substrate, at least one electric circuit forming a layer with the electrode circuit via the insulation substrate, and a conduction member for electrically conducting the electrode circuit and the electric circuit.

According to another aspect of the present invention, a thermoelectric converter which includes a P type thermoelectric element, an N type thermoelectric element, the N type thermoelectric element connected with the P type thermoelectric element alternately to be electrically in series, an electrode circuit contacting the P type thermoelectric element and the N type thermoelectric element, the electrode circuit having heat radiating side electrode which connects a heat radiating side surface of the P type thermoelectric element with a heat radiating side surface of the N type thermoelectric element and cooling side electrode which connects a cooling side surface of the P type thermoelectric element with a cooling side surface of the N type thermoelectric element, wherein at least either the heat radiating side electrode or the cooling side electrode is formed on two or more faces which connects P type thermoelectric element with N type thermoelectric element.

According to another aspect of the present invention, a manufacturing method of a thermoelectric converting device includes a first process for positioning a bar shaped P type thermoelectric element and a bar shaped N type thermoelectric element in parallel each other at an electrode circuit, a second process for cutting the bar shaped P type thermoelectric element and the bar shaped N type thermoelectric element to form P type thermoelectric elements and N type thermoelectric elements, and a third process for arranging the P type thermoelectric elements and the N type thermoelectric elements alternately to be electrically in series by connecting the electrode circuit to the P type thermoelectric element and the N type thermoelectric element.

BRIEF DESCRIPTION OF THE DRAWING FIGURES

The foregoing and additional features and characteristics of the present invention will become more apparent from the following detailed description considered with reference to the accompanying drawing figures in which like reference numerals designate like elements.

FIG. 13 is a chart showing a result of a cooling performance simulation of the thermoelectric converter of the first and the second embodiments and the known thermoelectric converter.

DETAILED DESCRIPTION OF THE INVENTION

Figure 1:
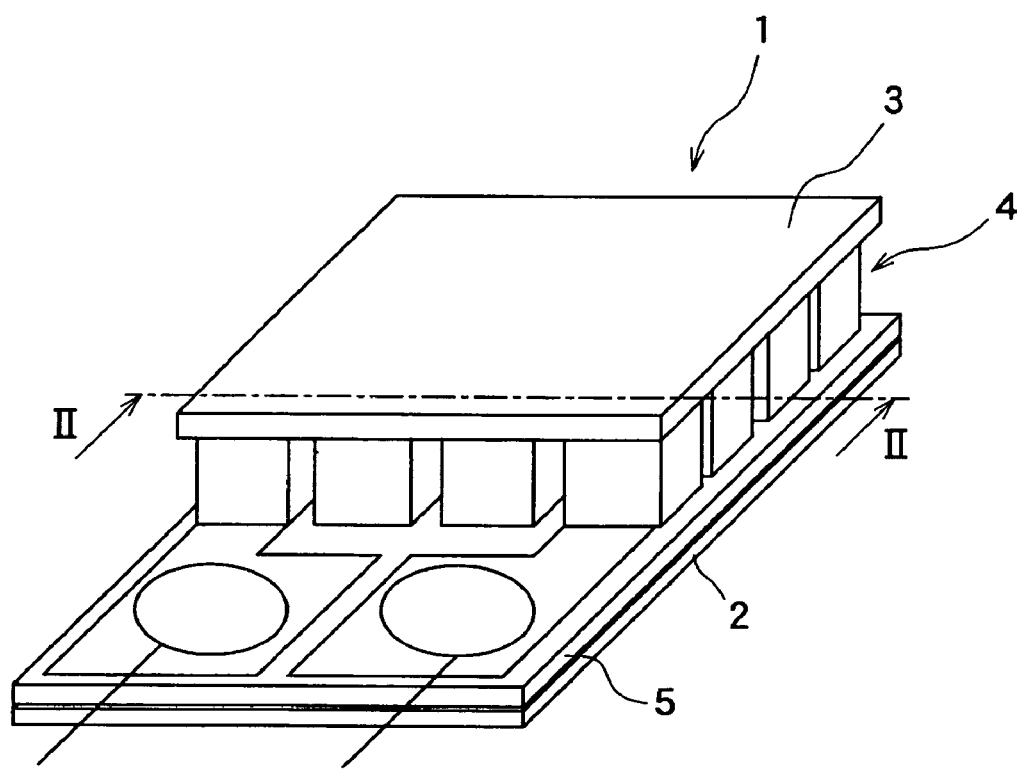
FIG. 1 shows a thermoelectric converter according to a first embodiment of the present invention.

Embodiments of the present invention will be explained with reference to the illustrations of the drawing figures as follows.

A thermoelectric converter 1 of a first embodiment includes a radiation side substrate 2 provided at a heat radiation side, a cooling side substrate 3 provided at a cooling side, a semiconductor chip 4 positioned between the radiation side substrate 2 and the cooling side substrate 3, and an insulation substrate 5 provided between the semiconductor chip 4 and the radiation side substrate 2.

Figure 2:
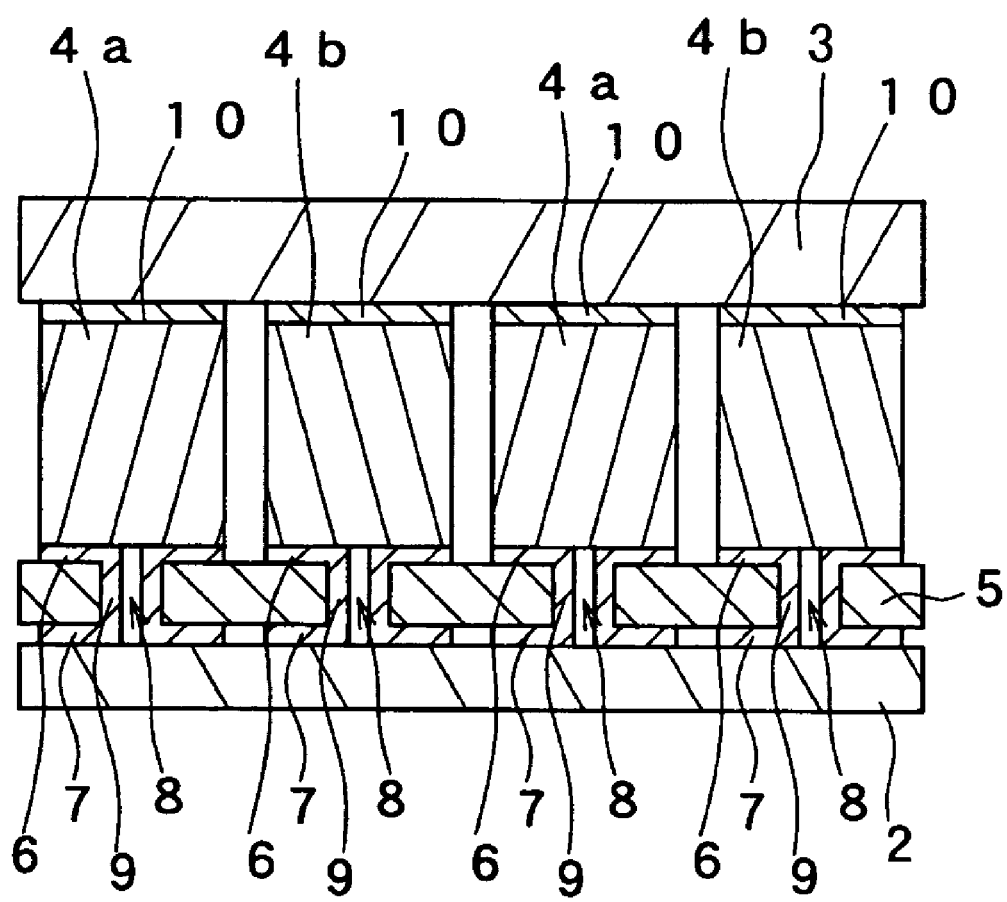
FIG. 2 is a cross sectional view taken on line II-II of the thermoelectric converter according to the first embodiment of the present invention.

As shown in FIG. 2, the semiconductor chip 4 includes P type semiconductor chips 4a serving as a P type thermoelectric element and N type semiconductor chips 4b serving as an N type thermoelectric element. The insulation substrate 5 is provided between the semiconductor chip 4 and the radiation side substrate 2. Heat radiation side electrode circuits 6 contacting a heat radiation surface of the P type semiconductor chip 4a and a heat radiation surface of the N type semiconductor chip 4b are provided between the insulation substrate 5 and the semiconductor chip 4. Electric circuits 7 are provided between the insulation substrate 5 and the radiation side substrate 2. The electric circuits 7 are stacked on the electrode circuits 6 via the insulation substrate 5. The heat radiation side electrode circuit 6 and the electric circuit 7 are conducted via a conduction member 9 formed at a penetration bore 8 provided at an arbitrary position of the insulation substrate 5. Cooling side electrode circuits 10 contacting a cooling surface of the P type semiconductor chip 4a and a cooling surface of the N type semiconductor chip 4b are provided between the semiconductor chip 4 and the cooling side substrate 3. The P type semiconductor chip 4a and the N type semiconductor chip 4b are connected alternately to be arranged electrically in series by the electrode circuit 6, the conduction member 9, the electric circuit 7, and the electrode circuit 10.

Figure 3:
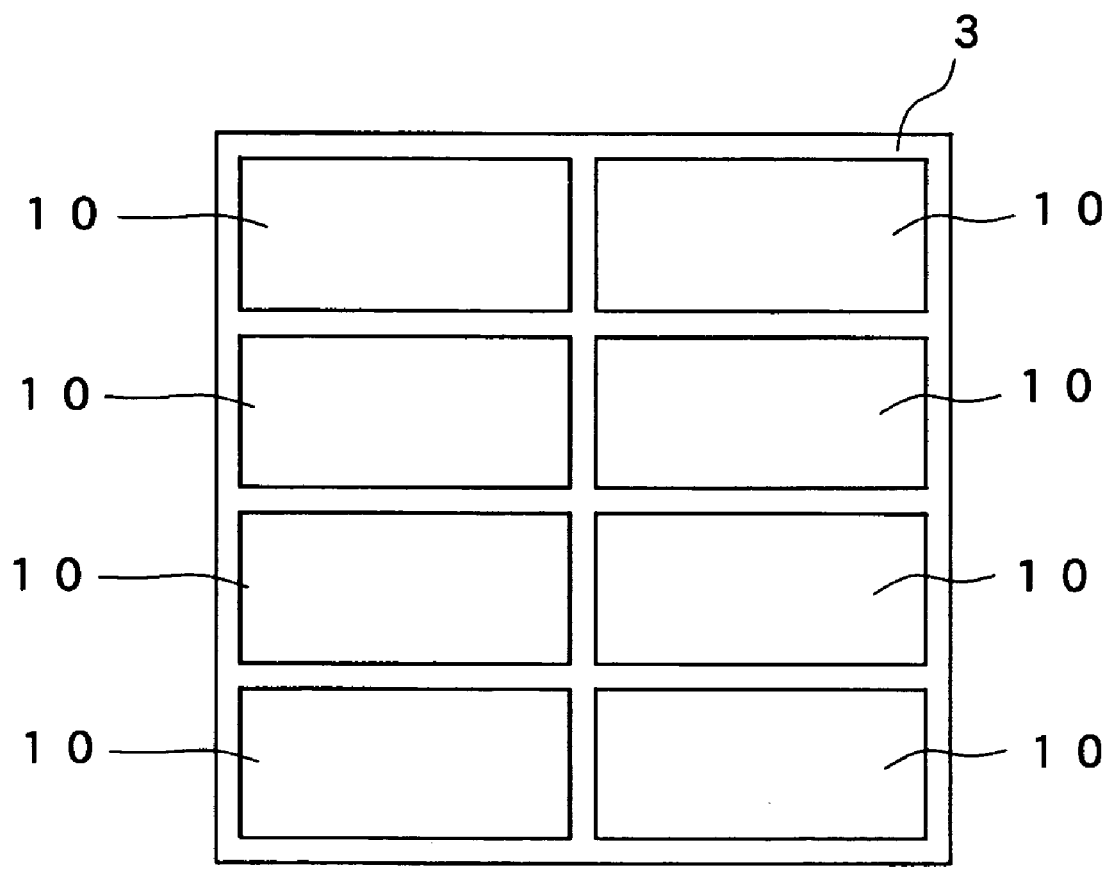
FIG. 3 shows a cooling side substrate of the thermoelectric converter and electrode circuits provided at a surface of the cooling side substrate according to the first embodiment of the present invention.

As shown in FIG. 3, the cooling side electrode circuits 10 are provided on a surface of the cooing side substrate 3 of the thermoelectric converter 1. The cooling side electrode circuit 10 conducts the cooling surface of the P type semiconductor chip 4a and the cooling surface of the N type semiconductor chip 4b. The cooling side substrate 3 may be made of alumina ceramic. Copper plating is applied on the entire surface of the cooling side substrate 3 with plating method to form a circuit by etching. The material used for the cooling side substrate 3 is not limited to the alumina ceramics and may be made of any materials having the insulation characteristics such as aluminum nitride, beryllium oxide, silicon carbide, or the like. The cooling side electrode circuit 10 may be made of any electric conductive materials such as gold, silver, molybdenum, tungsten, tin, copper-tungsten alloy, or the like.

Figure 4:
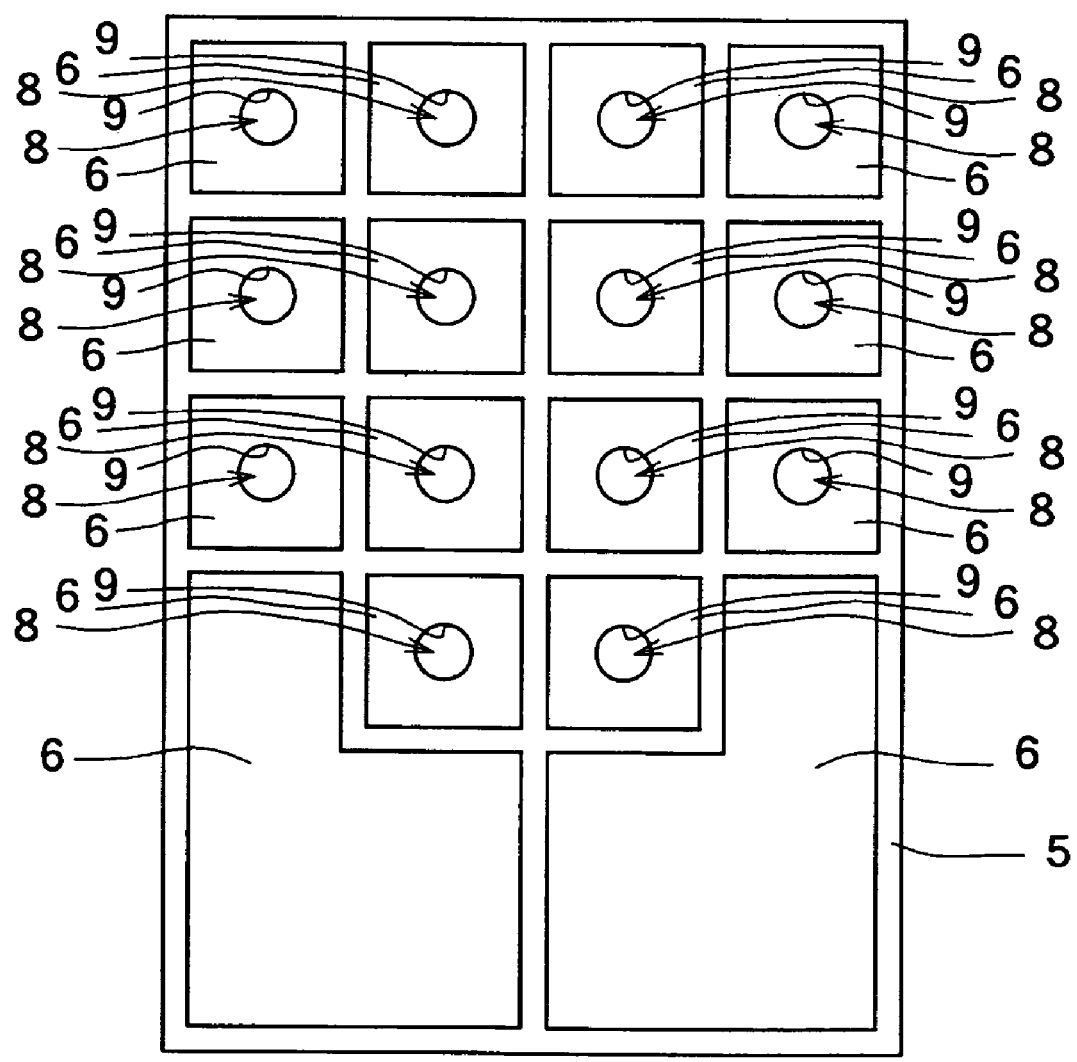
FIG. 4 shows electrode circuits provided at a surface of an insulation substrate at a semiconductor chip side, penetration bores provided at the insulation substrate, and a conduction member provided at the respective penetration bores according to the first embodiment of the present invention.

As shown in FIG. 4, the heat radiating side electrode circuits 6 provided at the surface of the semiconductor chip 4 side of the insulation substrate 5 of the thermoelectric converter 1 include the penetration bore 8 provided at the insulation substrate 5 and the conduction member 9 provided at the penetration bore 8 respectively. A heat radiating surface of the P type semiconductor chip 4a and a heat radiating surface of the N type semiconductor chip 4b contact the heat radiating side electrode circuit 6. The heat radiating side electrode circuit 6 and the electric circuit 7 conducts via the conduction member 9 provided at the penetration bore 8. The insulation substrate 5 made of aluminum ceramic is applied with copper plating by the plating method on the entire surface thereof to form the circuit 6 by the etching. The materials for the insulation substrate 5 is not limited to the alumina ceramic and made of any materials having the insulation such as aluminum nitride, beryllium oxide, silicon carbide, or the like. The electrode circuit 6 and the conduction member 9 may be made of any electric conductive materials such as gold, silver, molybdenum, tungsten, tin, copper-tungsten alloy, or the like.

Figure 5:
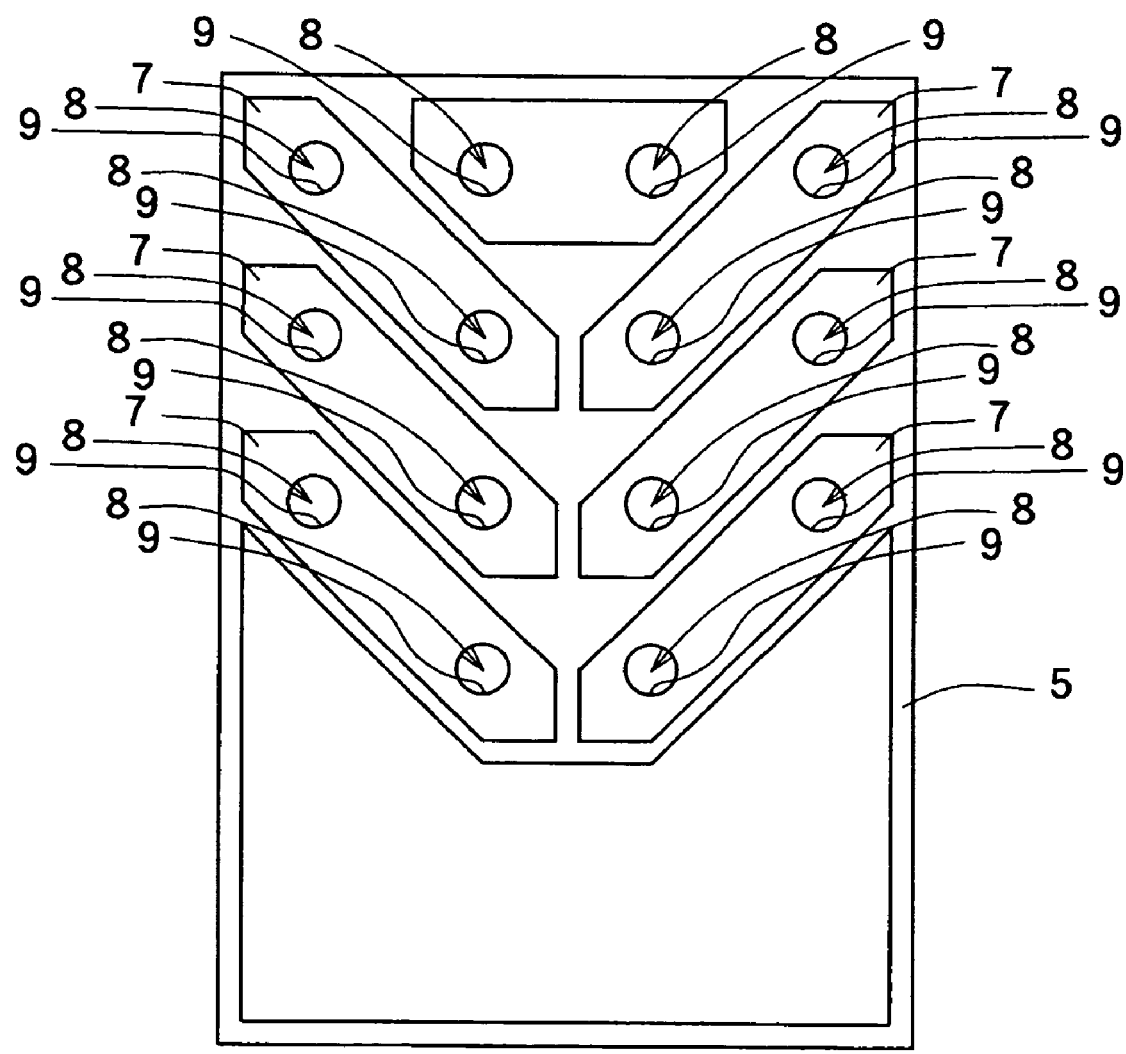
FIG. 5 shows electric circuits provided at a surface of the insulation substrate at a radiation side substrate, penetration bores provided at the insulation substrate, and a conduction member provided at the respective penetration bores according to the first embodiment of the present invention.

As shown in FIG. 5, the electric circuits 7 provided at a surface of the radiation side substrate 2 of the insulation substrate 5, the penetration bores 8 provided at the insulation substrate 5, and the conduction members 9 provided at the respective penetration bores 8 are provided at the thermoelectric converter 1. Applying the copper plating on the entire surface of the insulation substrate 5 by the plating method by the etching forms the electric circuits 7. The electric circuit 7 may be made of any electric conductive materials such as gold, silver, molybdenum, tungsten, tin, copper-tungsten alloy, or the like.

The radiation side substrate 2 shown in FIG. 2 is made of aluminum ceramic. The radiation side substrate 2 may be made of any insulation materials such as aluminum nitride, beryllium oxide, silicon carbide, or the like.

Figure 6:
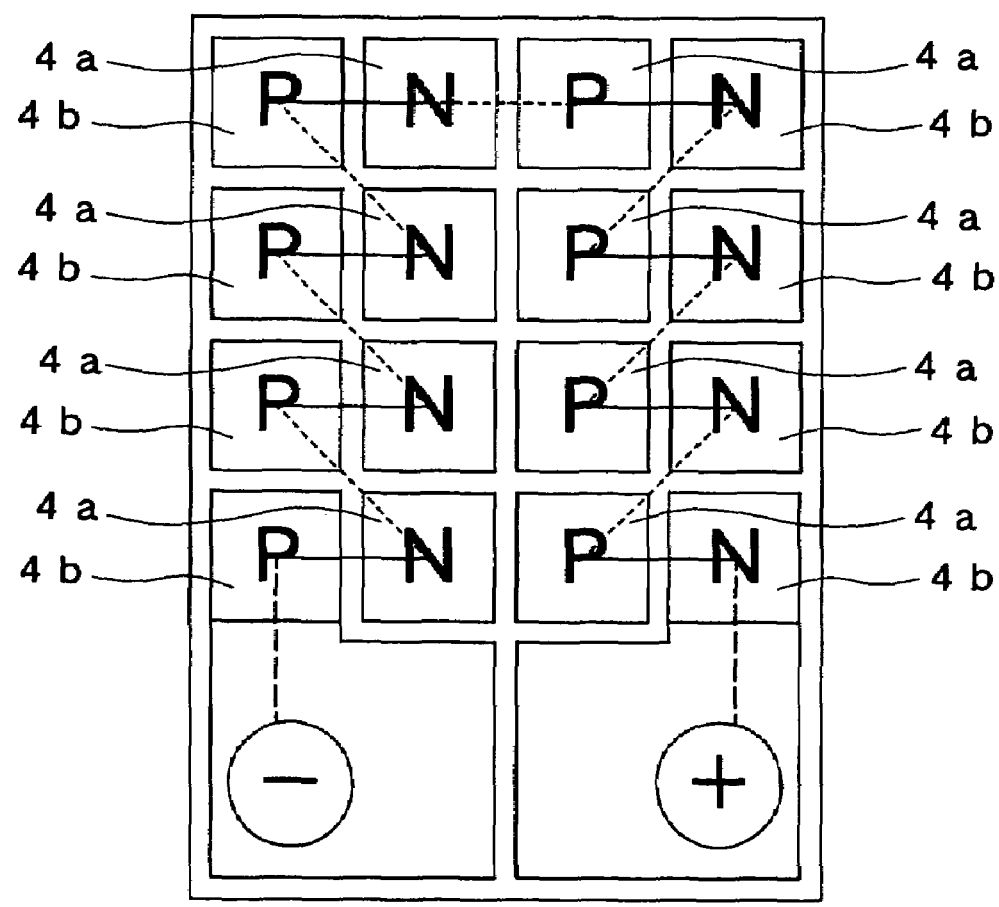
FIG. 6 shows an electric circuit of the thermoelectric converter according to the first embodiment of the present invention.

As shown in FIG. 6 showing the electric circuit of the thermoelectric converter 1, solid lines indicate a circuit for the cooling side electrode circuit 10, and dotted lines indicate circuits for the heat radiating side electrode circuit 6, the conduction member 9, and the electric circuit 7. The electric power supplied to the heat radiating side electrode circuit 6 by a lead wire is supplied to the P type semiconductor chip 4a and the N type semiconductor chip 4b which are connected alternately to be arranged electrically in series.

With the construction of the first embodiment, because the thermoelectric converter 1 includes the electric circuits 7 and the conduction members 9 conducting the electrode circuits 6 and the electric circuits 7, the P type semiconductor chip 4a and the N type semiconductor chip 4b can be connected alternately to be arranged electrically in series despite the linear arrangement of the P type semiconductor chips 4a and the N type semiconductor chips 4b respectively without the L shaped top surface electrode and the bottoms surface electrode as the known thermoelectric converter. Thus, with the foregoing construction of the thermoelectric converter 1, drawbacks of the decline of the cooling performance and the heating performance can be resolved.

With the construction of the thermoelectric converter 1 according to the first embodiment of the present invention, because the heat radiating surface of the P type semiconductor chips 4a and the heat radiating surface of the N type semiconductor chips 4b are linearly arranged relative to the heat radiating side electrode circuit 6 respectively, the assembling time of the P type semiconductor chips 4a and the N type semiconductor chips 4b can be reduced compared to the zigzag arrangement of the P type semiconductor chips and the N type semiconductor chips of the known thermoelectric converter, which improves the productivity.

With the construction of the thermoelectric converter 1 according to the first embodiment of the present invention, the heat radiating surface of the P type semiconductor chips 4a electrically connects to the heat radiating surface of the N type semiconductor chips 4b via the heat radiating side electrode circuit 6, the conduction member 9, and the electric circuit 7. The heat radiating side electrode circuit 6 is provided at one surface of the insulation substrate 5, and the electric circuit 7 is provided at the other surface of the insulation substrate 5. Accordingly, the present invention have an advantage to increase the freedom of arrangement or shape of the electrode so that the drawbacks of the decline of the cooling performance and the heating performance can be resolved even if the P type semiconductor chips 4a and the N type semiconductor chips 4b are linearly arranged.

Because the insulation substrate 5 is provided between the electrode circuits 6 and the electric circuits 7, the electric circuit 7 is stacked on the electrode circuit 6 via the insulation substrate 5 to form the layer. By applying the plating with copper, or the like, corresponding to the electric conductive materials at the entire surface of the insulation substrate 5 with plating method and etching thereafter, the electrode circuits 6 and the electric circuits 7 can be easily formed at the surface of the insulation substrate 5.

Further, by forming the penetration bore 8 at the arbitrary portion of the insulation substrate 5 by a laser, or the like, and plating the penetration bore 8 thereafter, the conduction member 9 conducting the electrode circuit 6 and the electric circuit 7 provided at the surface of the insulation substrate 5 can be provided easily. In case alumina ceramic is used for the insulation substrate 5, the penetration bore 8 can be formed easily by forming the penetration bore 8 at a green sheet before sintering to be alumina ceramic.

Figure 7:
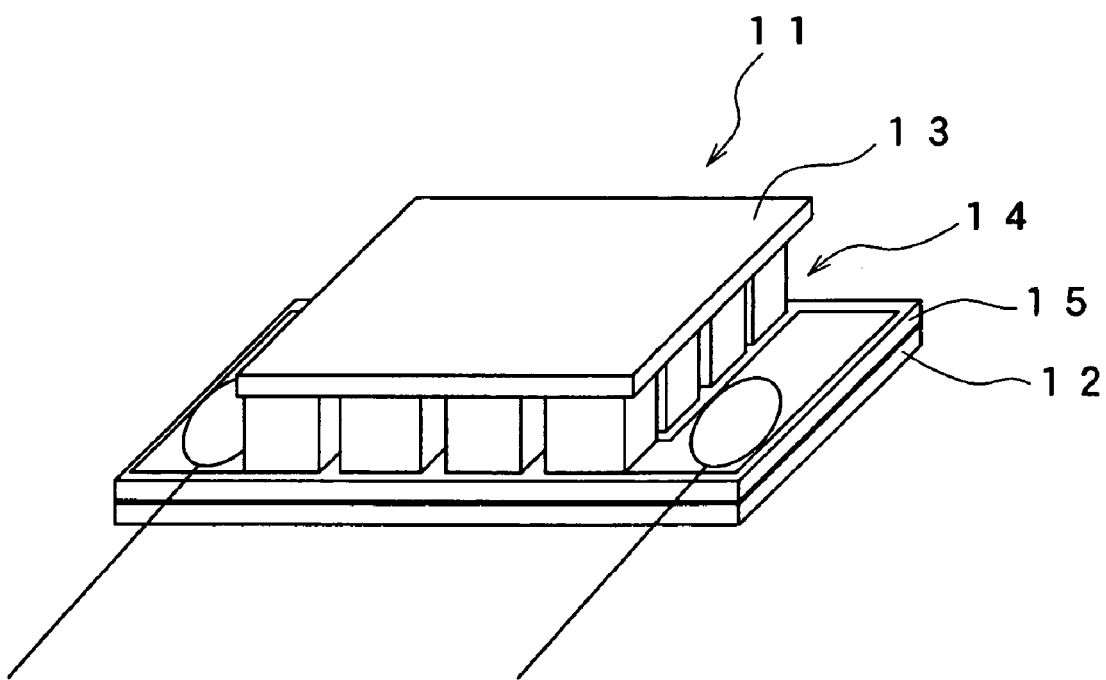
FIG. 7 shows a thermoelectric converter according to a second embodiment of the present invention.

As shown in FIG. 7, a thermoelectric converter 11 of a second embodiment includes a radiation side substrate 12 provided at the radiation side, a cooling side substrate 13 provided at the cooling side, a semiconductor chip 14 positioned between the radiation side substrate 12 and the cooling side substrate 13, and an insulation substrate 15. The thermoelectric converter 11 of the second embodiment is basically identical with the thermoelectric converter 1 of the first embodiment. The construction of a heat radiation side electrode circuit 16 (shown in FIG. 9) and an electric circuit 17 (shown in FIG. 10) of the second embodiment is different from the electrode circuit 6 and the electric circuit 7 of the first embodiment.

Figure 8:
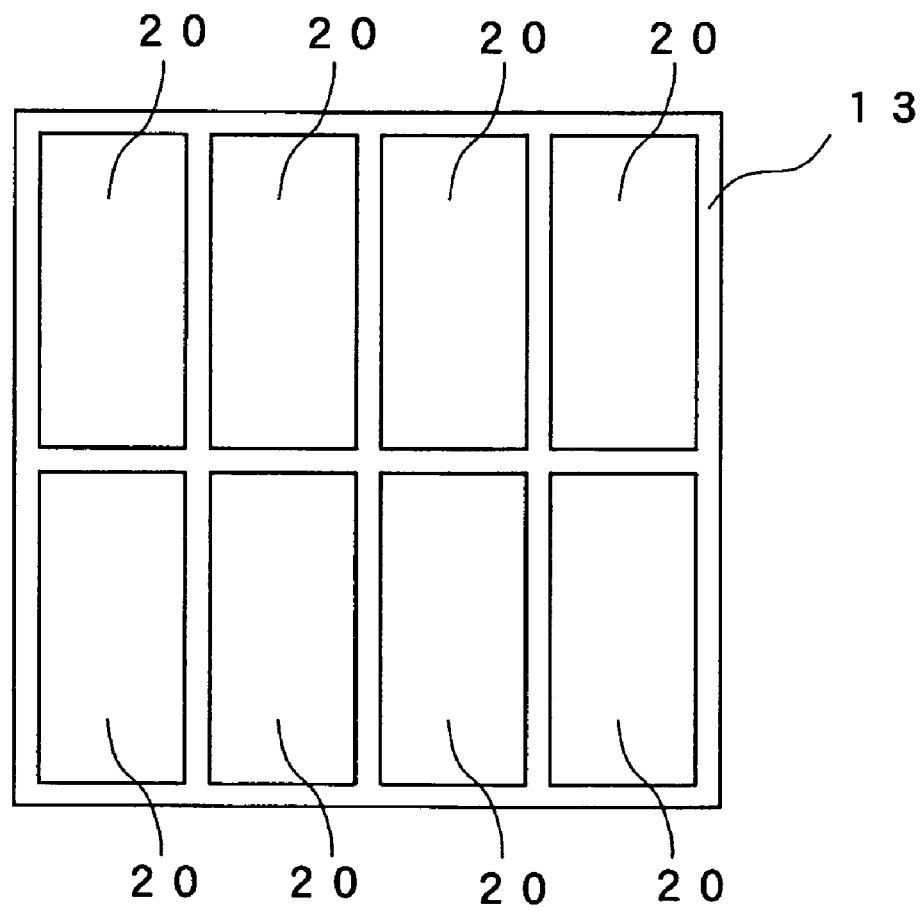
FIG. 8 shows a cooling side substrate of the thermoelectric converter and electrode circuits provided at a surface of the cooling side substrate according to the second embodiment of the present invention.

As shown in FIG. 8, cooling side electrode circuits 20 are provided at a surface of the cooling side substrate 13. The cooling side electrode circuit 20 conducts a cooling surface of the P type semiconductor chip 14a and a cooling surface of the N type semiconductor chip 14b. The cooling side substrate 13 made of alumina ceramic is applied with plating by the plating method at the entire surface thereof to form a circuit by etching. The cooling side substrate 13 may be made of any materials including the insulation such as aluminum nitride, beryllium oxide, silicon carbide, or the like. The materials for the cooling side electrode circuit 20 is not limited to the copper and made of any materials having the electric conductivity such as gold, silver, molybdenum, tungsten, tin, copper-tungsten alloy, or the like.

Figure 9:
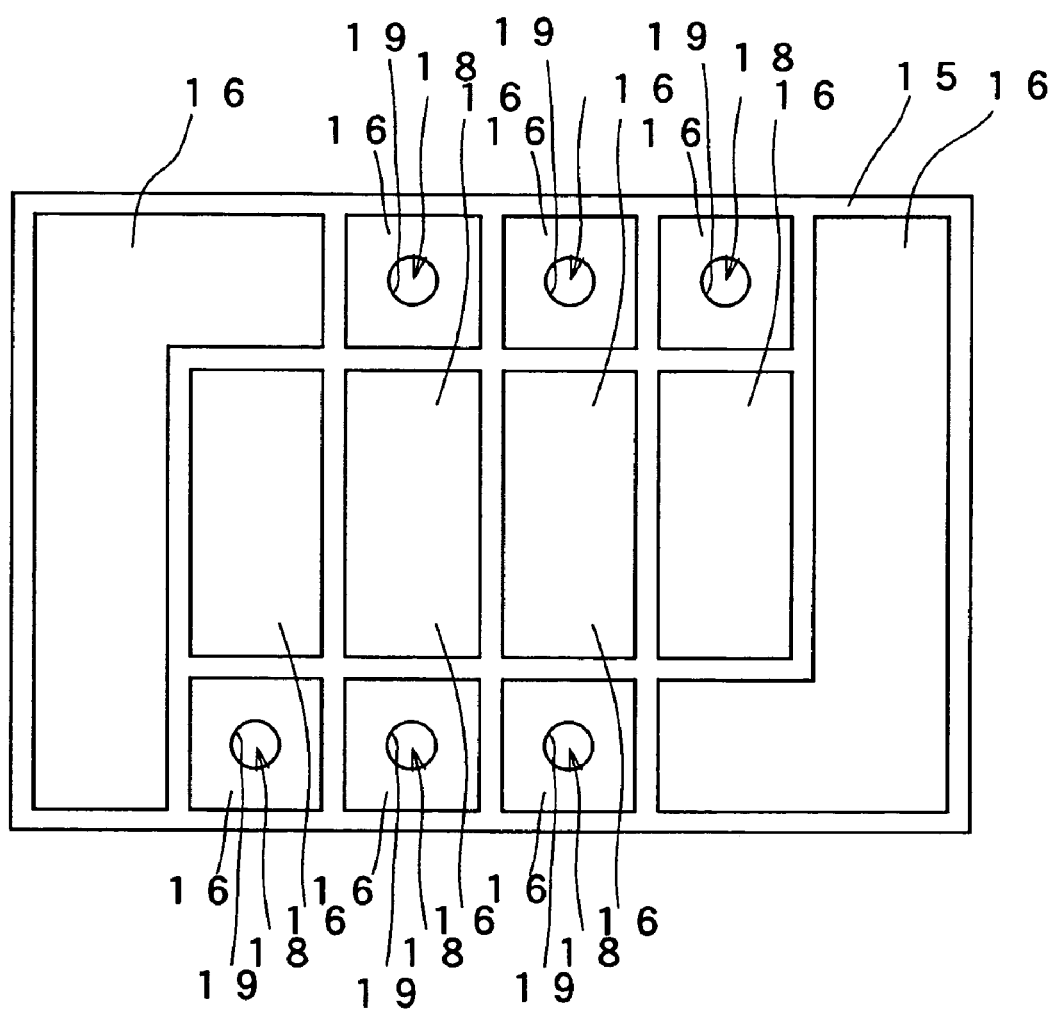
FIG. 9 shows electrode circuits provided at a surface of an insulation substrate at a semiconductor chip side of the thermoelectric converter, penetration bores provided at the insulation substrate, and a conduction member provided at the respective penetration bores according to the second embodiment of the present invention.

FIG. 9 shows the heat radiating side electrode circuits 16 provided on the surface of the insulation substrate 15 at the semiconductor chip 14 side of the thermoelectric converter 11, the penetration bores 18 provided at the insulation substrate 15, and the conduction member 19 provided at the respective penetration bores 18. The heat radiating side electrode circuit 16 contacts a heat radiating surface of the P type semiconductor chip 14a and a heat radiating surface of the N type semiconductor chip 14b. The heat radiating side electrode circuit 16 and the electric circuit 17 are conducted via the conduction member 19 provided at the penetration bore 18. The insulation substrate 15 made of alumina ceramic is applied with the plating at the entire surface thereof by plating method to form a circuit by etching. The insulation substrate 15 may be made of any materials having the insulation such as aluminum nitride, beryllium oxide, silicon carbide, or the like. The material for the electrode circuit 16 and the conduction member 19 is not limited to the copper and made of any materials having the electric conductivity such as gold, silver, molybdenum, tungsten, tin, copper-tungsten alloy, or the like.

Figure 10:
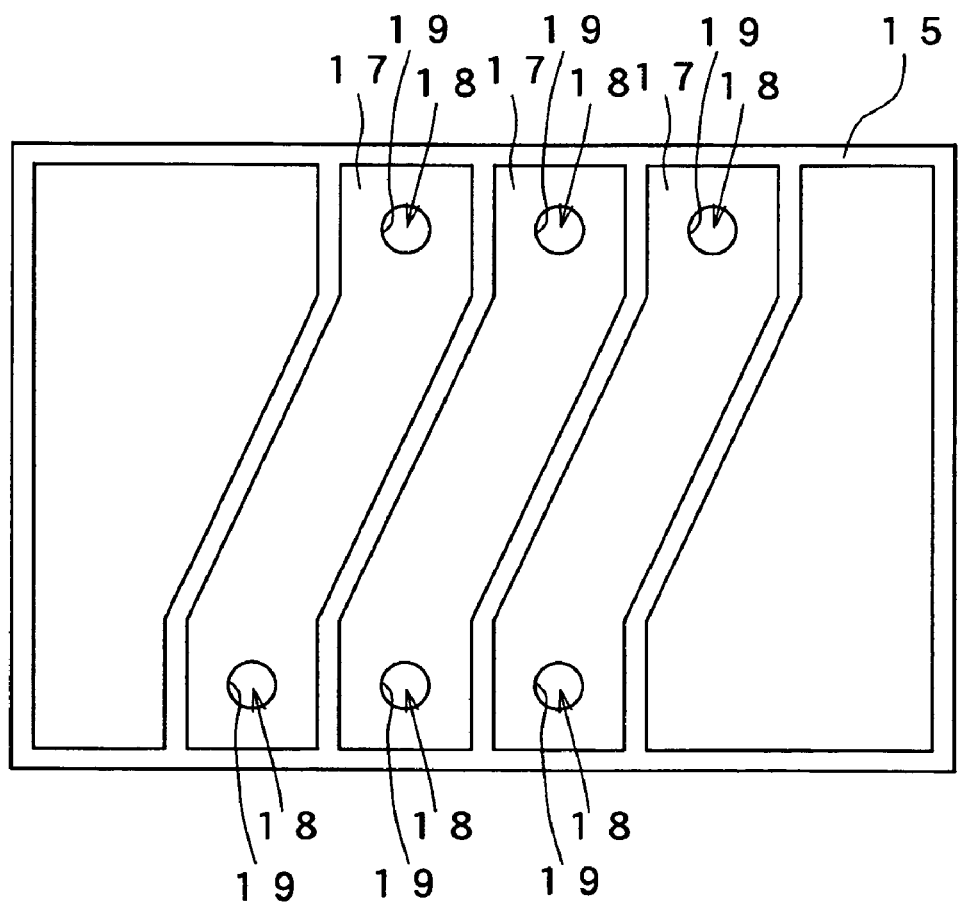
FIG. 10 shows electric circuits provided at a surface of the insulation substrate at a radiation side substrate, penetration bores provided at the insulation substrate, and a conduction member provided at the respective penetration bores of the thermoelectric converter according to the second embodiment of the present invention.

As shown in FIG. 10, the thermoelectric converter 11 includes the electric circuits 17 provided on the surface of the insulation substrate 15 at the radiation side substrate 12 side, the penetration bores 18 provided at the insulation substrate 15, and the conduction member 19 provided at the respective penetration bores 18. The electric circuit 17 is formed by providing copper plating on the entire surface of the insulation substrate 15 with plating method to provide the circuit thereon by etching. The materials for the electric circuit 17 is not limited to the copper and may be any electric conductive materials such as gold, silver, molybdenum, tungsten, tin, copper-tungsten alloy, or the like.

Although the radiation side substrate 12 shown in FIG. 7 is made of alumina ceramic, the radiation side substrate 12 may be made of any materials having the insulation such as aluminum nitride, beryllium oxide, silicon carbide, or the like.

Figure 11:
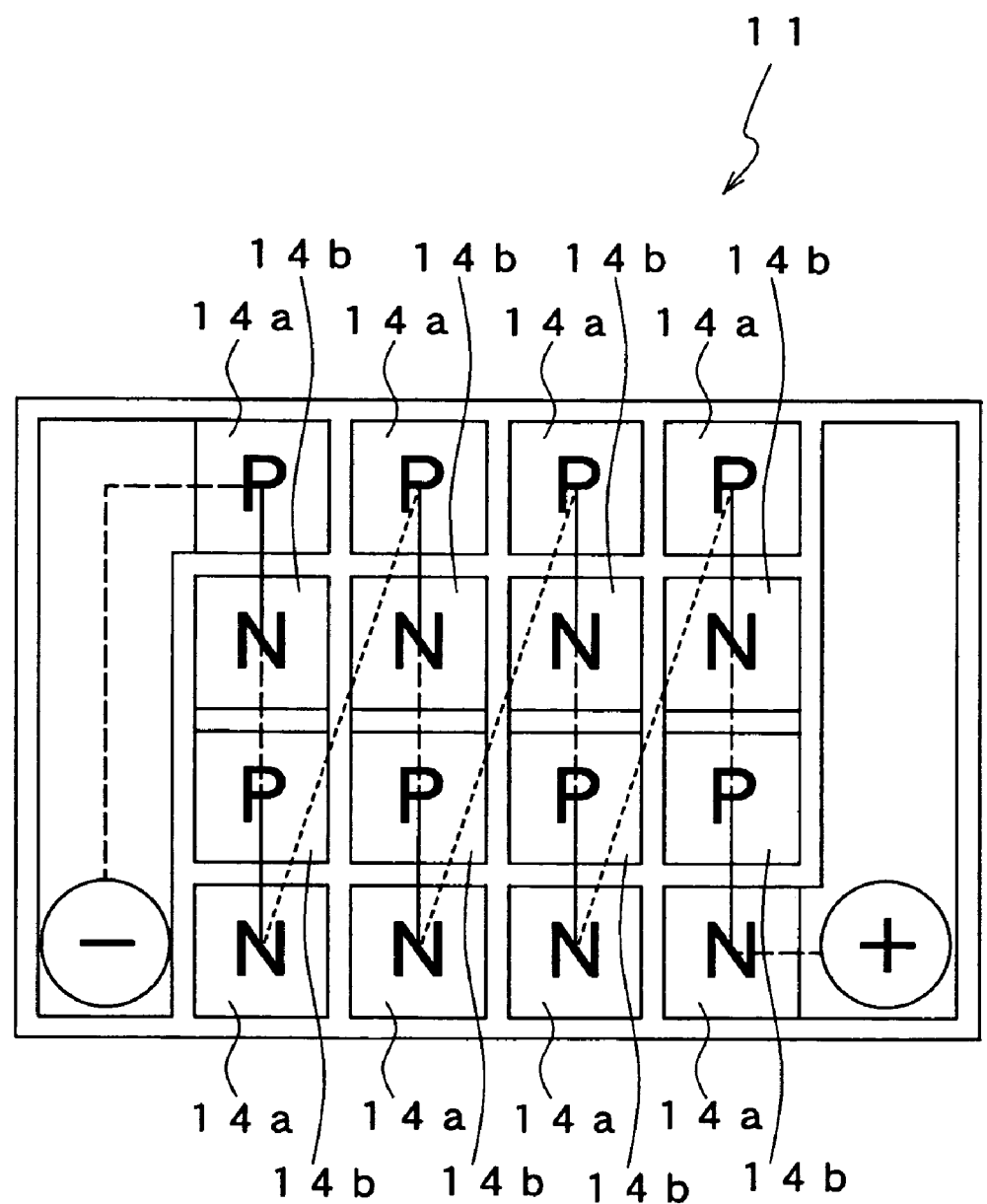
FIG. 11 shows an electric circuit of the thermoelectric converter according to the second embodiment of the present invention.

As shown in FIG. 11, the thermoelectric converter 11 includes a circuit of the cooling side electrode circuit 20 indicated with solid lines and a circuit of the heat radiating side electric circuit 16, the conductive member 19, and the electric circuit 17 indicated with dotted lines. The electric power supplied to the electrode circuit 16 is supplied to the P type semiconductor chips 14a and the N type semiconductor chips 14b connected alternately to be arranged electrically in series.

The thermoelectric conductor 11 of the second embodiment includes the operational effect likewise the thermoelectric converter 1 of the first embodiment of the present invention. With the construction of the thermoelectric converter 11 of the second embodiment of the present invention, because the electric circuit 17 and the heat radiating side electrode circuit 16 forms the layer, it is not required to conduct the electricity to the adjacent P type semiconductor chips 14a and to the adjacent N type semiconductor chips 14b. Thus, as shown in the electric circuit 17 of FIG. 10, the P type semiconductor chip 14a and the N type semiconductor chip 14b positioned apart from each other can be connected alternately to be arranged electrically in series. The freedom for the circuit design for connecting the P type semiconductor chip 14a and the N type semiconductor chip 14b alternately to be electrically in series is improved.

Figure 12:
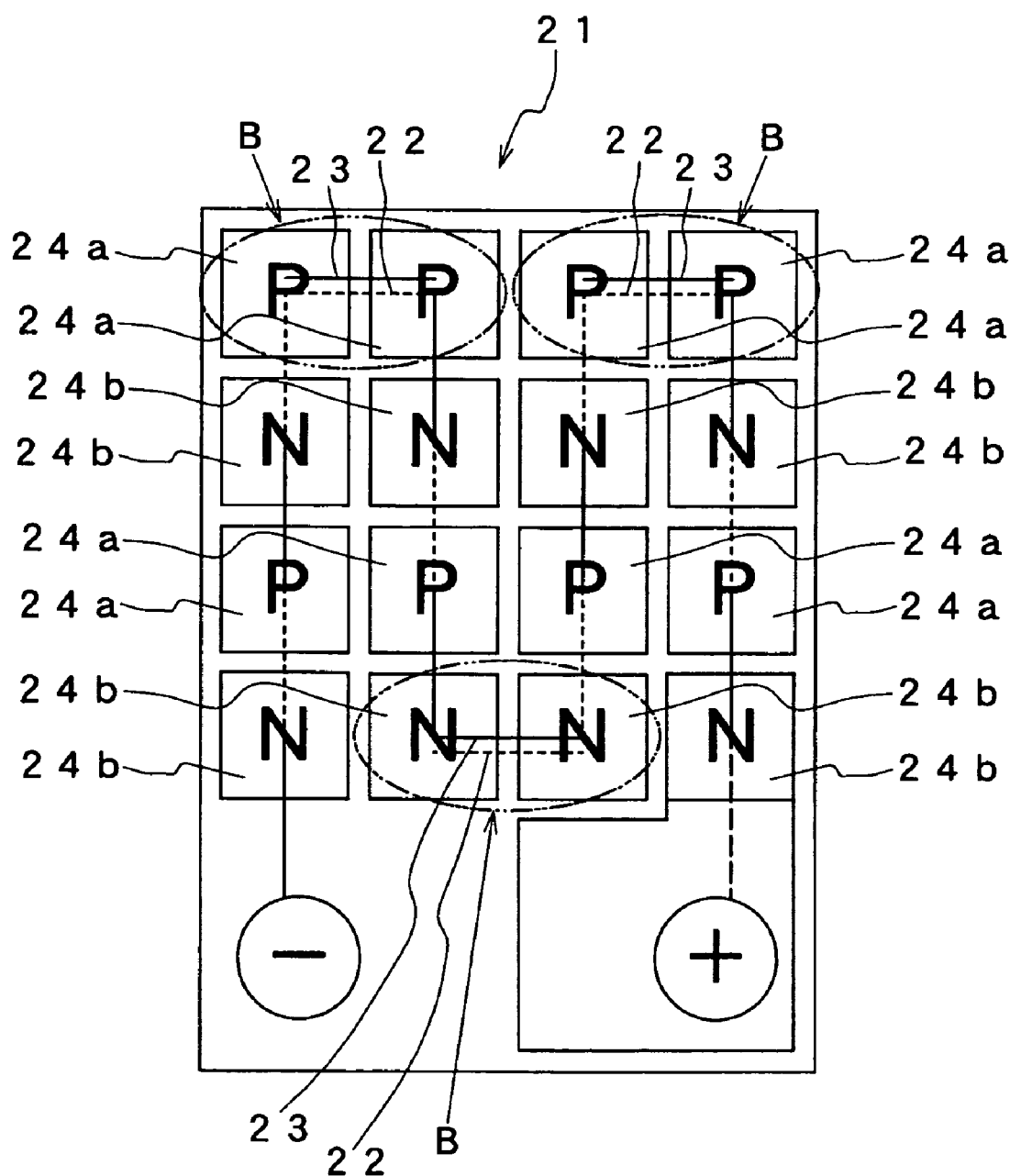
FIG. 12 shows an electric circuit of a known thermoelectric converter with L-shaped top surface electrodes and bottom surface electrodes.

FIG. 12 shows the known electric circuit of a thermoelectric converter 21 including L shaped top surface electrodes 22 and bottom surface electrodes 23. The thermoelectric converter 21 does not include members corresponding to the electric circuits 7, 17 of the thermoelectric converter 1, 11. With the L shaped top surface electrode 22 and the bottoms surface electrode 23 at portions B, the N type thermoelectric semiconductor chips or the P type thermoelectric semiconductor chips are connected in parallel.

FIG. 13 shows the result of the cooling performance simulation of the thermoelectric converter 21 including the known L shaped top surface electrode 22 and the bottoms surface electrode 23, and the thermoelectric converters 1, 11 of the embodiment of the present invention. The simulation result shows the power consumption conducted under the state that endothermic amount is 0.15W, the cooling surface temperature of the cooling side substrate is at 25° C., and the radiation surface temperature of the radiation side substrate is at 75° C. The power consumption of the thermoelectric converter 21 including the known L shaped top surface electrode 22 and the bottom surface electrode 23 is larger than that of the thermoelectric converters 1, 11 of the embodiment of the present invention. The large power consumption of the thermoelectric converter 21 is caused by the small Peltier effect at the top surface electrode 22 and the bottom surface electrode 23 at the portions B.

Figure 14:
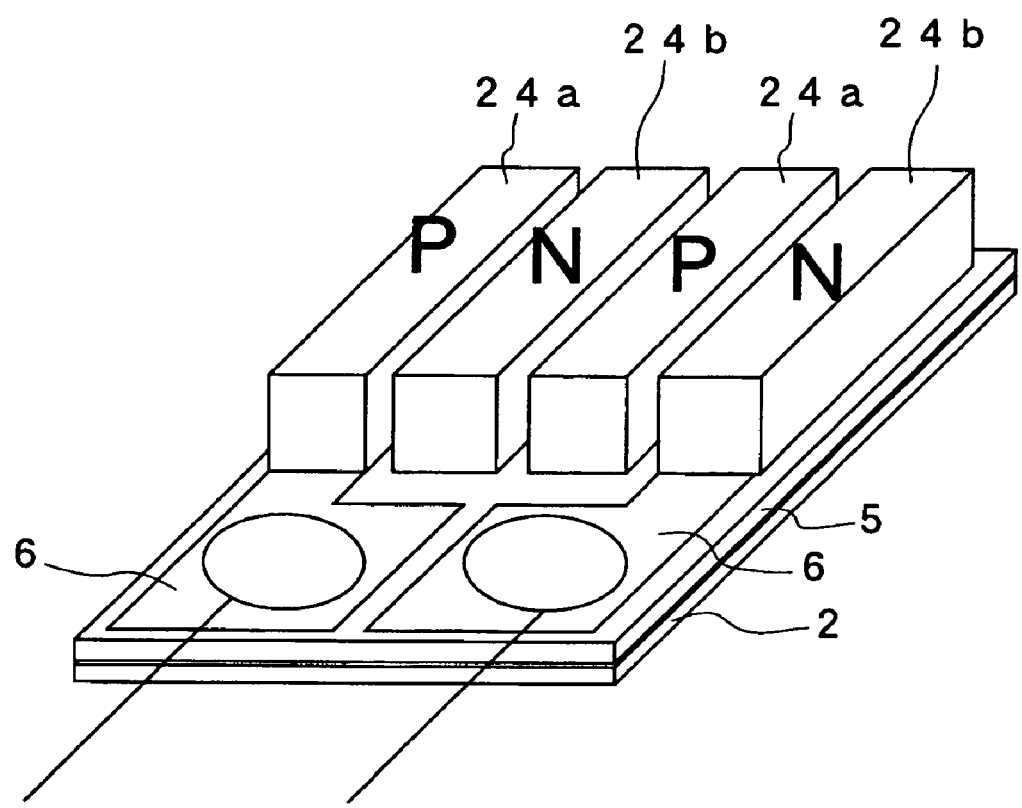
FIG. 14 is a first process of a manufacturing method of the thermoelectric converter of the first embodiment of the present invention.

FIG. 14 shows a first process of a manufacturing method of the thermoelectric converter 1 of the first embodiment. A bar shaped P type semiconductor chips 24a and a bar shaped N type semiconductor chips 24b are positioned alternately at the heat radiating side electrode circuit 6 in parallel one another. The electric circuit 7 is positioned between the insulation substrate 5 and the thermoelectric side substrate 2. The heat radiating side electrode circuit 6 and the electric circuit 7 are electrically conducted via the conduction member 9.

Figure 15:
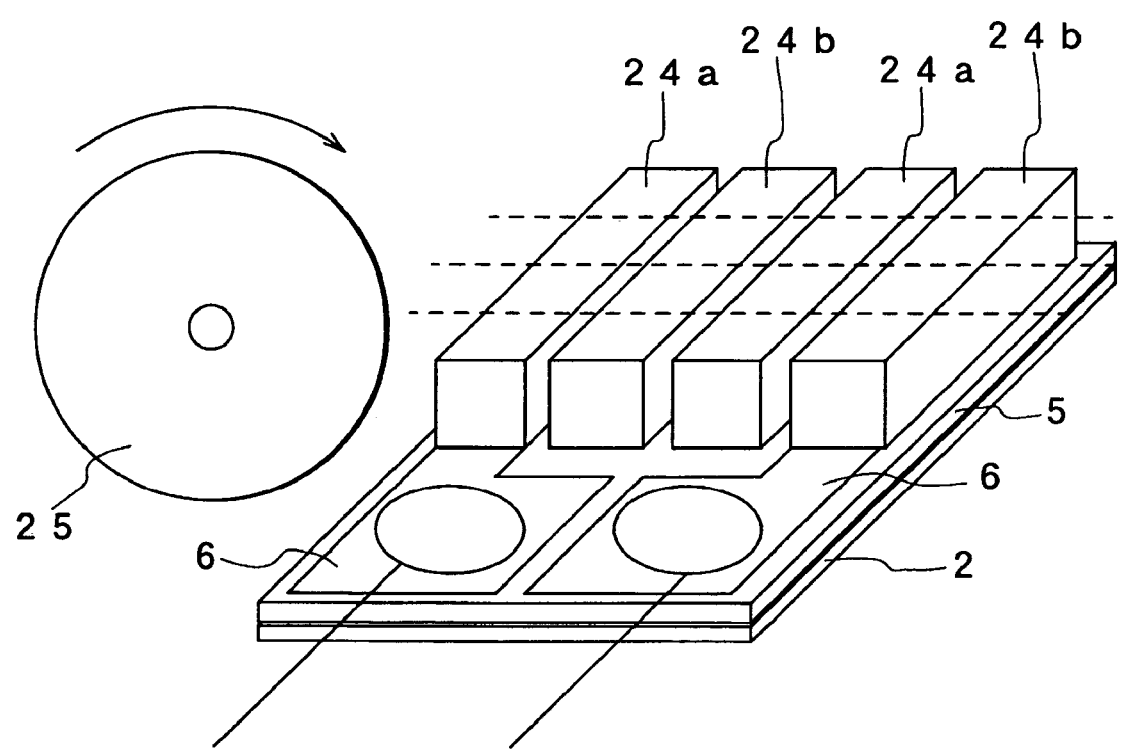
FIG. 15 is a second process of the manufacturing method of the thermoelectric converter of the first embodiment of the present invention.

FIG. 15 shows a second process of the manufacturing method of the thermoelectric converter 1 of the first embodiment. The bar shaped P type semiconductor chips 24a and the bar shaped N type semiconductor chips 24b are cut with a diamond cutter (i.e., a grinder) 25. Although the P type semiconductor chip 24a and the N type semiconductor chip 24b are cut by the diamond cutter in this embodiment, the cutting method is not limited and a wire cut or the like may be applied.

Figure 16:
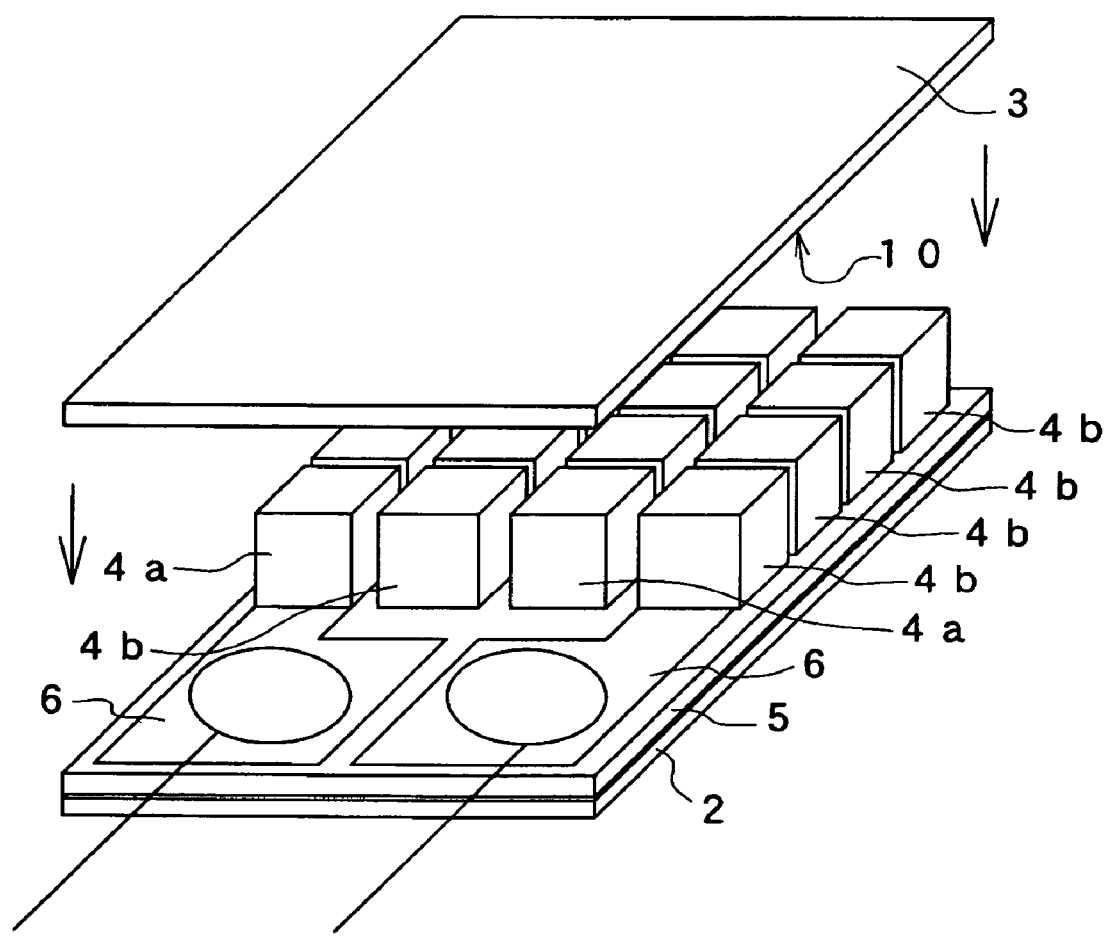
FIG. 16 is a third process of the manufacturing method of the thermoelectric converter of the first embodiment of the present invention.

FIG. 16 shows a third process of the manufacturing method of the thermoelectric converter 1 of the first embodiment of the present invention. The N type semiconductor chips 4b formed by cutting the bar shaped N type semiconductor chip 24b and the P type semiconductor chips 4a formed by cutting the bar shaped P type semiconductor chip 24a are connected alternately to be arranged electrically in series by the cooling side electrode circuits 10 provided at the cooling substrate 3.

With the construction of the embodiment, because the bar shaped P type semiconductor chip 24a and the bar shaped N type semiconductor chip 24b are positioned in parallel with the heat radiating side electrode circuits 6 at the first process of the manufacturing method, the manufacturing hours for positioning the bar shaped P type semiconductor chip 24a and the bar shaped N type semiconductor chip 24b can be reduced compared to positioning the P type semiconductor chips 4a and the N type semiconductor chips 4b at the zigzag arrangement. With the construction of the embodiment, the P type semiconductor chip 4a and the N type semiconductor chip 4b can be connected alternately to be arranged electrically in series by cutting the bar shaped P type semiconductor chip 24a and the bar shaped N type semiconductor chip 24b at the second process of the manufacturing method and by connecting the electrode circuits 10 to the P type semiconductor chips 4a and the N type semiconductor chips 4b processed at the third process of the manufacturing method. Because the bar shaped P type semiconductor chip 24a and the bar shaped N type semiconductor chip 24b at the first process is arranged to be positioned in parallel with the heat radiating side electrode circuits 6 with the construction of the embodiment, the manufacturing hours for positioning the P type semiconductor chips 4a and the N type semiconductor chips 4b can be largely reduced to reduce the total manufacturing hours of the thermoelectric converter 1 even if the process for cutting the bar shaped P type semiconductor chips 24a and the bar shaped N type semiconductor chips 24b at the second process is included. Further, the drawback that the cooling or the heating performance declines is resolved because the P type semiconductor chips 4a and the N type semiconductor chips 4b are connected alternately to be arranged electrically in series.

Although the side provided with the insulation substrate 5, 15 is defined as the heating side with the thermoelectric converter 1, 11, the heating side and the radiation side may be reversed by changing the polarity for electrically conducting to the P type semiconductor chip 4a, 14a and the N type semiconductor chip 4b, 14b. Although the thermoelectric converter 1, 11 include the radiation side substrate 2, 12, and the cooling side substrate 3, 13 in the embodiments, the radiation side substrate 2, 12, and the cooling side substrate 3, 13 may not be included in case the body to be cooled and the body to be heated corresponds to the insulation materials. In that case, the electrode circuits 10, 20 are provided between the semiconductor chip 4, 14 and the body to be cooled or the body to be heated and the electric circuits 7, 17 are provided between the insulation substrate 5, 15 and the body to be cooled or the body to be heated. Although the cooling effect and the heating effect by Peltier effect is explained in the embodiments, the present invention is applicable to the improvement of the electric power generation efficiency by Seebeck effect, or the like.

According to the embodiments of the present invention, the P type thermoelectric element and the N type thermoelectric element are positioned in series. This provides the thermoelectric converter and the manufacturing method thereof with high productivity, with high cooling or heating performance, and with high power generation efficiency.

According to the embodiments of the present invention, the thermoelectric converting device includes at least one electric circuit constructing the layer with the electrode circuit via the insulation substrate and the conduction member for conducting the electrode circuit and the electric circuit. Thus, the P type thermoelectric element and the N type thermoelectric element can be connected in series to be arranged alternately even if the P type thermoelectric element and the N type thermoelectric element are arranged linearly. Accordingly, the drawbacks of the declines of the power generation efficiency and the cooling and heating performance due to the declines of the Peltier effect or Seebeck effect, or the like, can be resolved.

According to the embodiments of the present invention, the P type thermoelectric elements and the N type thermoelectric elements are linearly arranged at the electrode circuit respectively. Thus, the manufacturing hours of the P type thermoelectric elements and the N type thermoelectric elements can be reduced to increase the productivity.

According to the embodiments of the present invention, the electric circuit and the electrode circuit form the layer via the insulation substrate because the insulation substrate is provided between the electrode circuit and the electric circuit. By applying the plating with copper, or the like, corresponding to the electrically conductive materials by the plating method at the entire surface of the insulation substrate and by etching thereon thereafter, the electrode circuit and the electric circuit can be easily formed at the surface of the insulation substrate.

According to the embodiments of the present invention, by forming the penetration bore at the arbitrary portion of the insulation substrate with the laser and by plating the penetration bore thereafter, the conduction member for conducting the electrode circuit and the electric circuit provided at the surface of the insulation substrate can be easily provided. In case alumina ceramics is used for the insulation substrate, the penetration bore can be provided easily by forming the penetration on the green sheet before sintering to be alumina ceramics.

According to the embodiments of the present invention, the bar shaped P type thermoelectric element and the bar shaped thermoelectric element are positioned at the electrode circuit to be parallel one another at the first process of the manufacturing process. Thus, the manufacturing hours for positioning the P type thermoelectric elements and the N type thermoelectric elements can be largely reduced compared to the zigzag arrangement of the P type thermoelectric elements and the N type thermoelectric elements. By cutting the bar shaped P type thermoelectric element and the bar shaped thermoelectric element to form the P type thermoelectric elements and the N type thermoelectric elements at the second process and by connecting the electrode circuit to the P type thermoelectric elements and the N type thermoelectric elements alternately to be in series. Because the manufacturing hours for positioning the bar shaped P type thermoelectric element and the bar shaped N type thermoelectric element to be parallel to the electrode circuit can be reduced largely, the total manufacturing hours for the thermoelectric converting device can be reduced even if the process for cutting the bar shaped P type thermoelectric element and the bar shaped N type thermoelectric element is included at the second process. Further, because the P type thermoelectric elements and the N type thermoelectric elements are connected alternately to be in series, the drawbacks of the declines of the power generation effect and the cooling or heating performance can be resolved.

The principles, preferred embodiment and mode of operation of the present invention have been described in the foregoing specification. However, the invention which is intended to be protected is not to be construed as limited to the particular embodiments disclosed. Further, the embodiment described herein is to be regarded as illustrative rather than restrictive. Variations and changes may be made by others, and equivalents employed, without departing from the spirit of the present invention. Accordingly, it is expressly intended that all such variations, changes and equivalents which fall within the spirit and scope of the present invention as defined in the claims, be embraced thereby.

The invention claimed is:

1. A single-stage thermoelectric converting device comprising:
   a P type thermoelectric element;
   an N type thermoelectric element wherein the P type and N type thermoelectric elements are arranged in a single stage configuration;
   an electrode circuit contacting an end of the P type thermoelectric element and an end of the N type thermoelectric element for establishing an in-series connection there between;
   an insulation substrate positioned adjacent to the ends of the P type and N type thermoelectric elements, wherein the insulation substrate includes a plurality of penetration bores;
   an electric circuit formed on a side of the insulation substrate, wherein the electric circuit, the insulation substrate, and the electrode circuit being formed into a layered structure wherein the electrode circuit and the electric circuit are provided at opposite sides of the insulation substrate respectively; and
   a conduction member passing through the penetration bores of the insulation substrate and electrically conducting the electrode circuit and the electric circuit.

2. The single-stage thermoelectric converting device according to claim 1, wherein the P type thermoelectric element and the N type thermoelectric element are arranged in a linear mode along the electric circuit.

3. The single-stage thermoelectric converting device according to claim 1, wherein:
   the P type thermoelectric element comprises a plurality of P type thermoelectric elements and the N type thermoelectric element comprises a plurality of N type thermoelectric elements,
   the plurality of P type and N type thermoelectric elements being arranged in a plurality of linear arrays to form a grid pattern, and
   the electric circuit comprises a plurality of electric circuits, at least one electric circuit connecting a P type thermoelectric element to an N type thermoelectric element in a different linear array of elements.

4. The single-stage thermoelectric converting device according to claim 3, wherein the at least one electric circuit connects a P type thermoelectric element to a diagonally adjacent N type thermoelectric element in a different linear array of elements.

5. The single-stage thermoelectric converting device according to claim 3, wherein the at least one electric circuit connects a P type thermoelectric element to a non-adjacent N type thermoelectric element in a different linear array of elements.

6. The single-stage thermoelectric converting device according to claim 3, wherein the electrode circuit comprises a plurality of electrode circuits each connecting a P type thermoelectric element to an N type thermoelectric element in a same linear array of elements.

7. The single-stage thermoelectric converting device according to claim 1, wherein the plurality of electrode circuits are provided on a same side of the insulating substrate such that each electrode circuit connects a P type thermoelectric element to an N type thermoelectric element on a same side of the insulating substrate.

* * * * *